US009343353B2

(12) United States Patent
Hurwitz et al.

(10) Patent No.: US 9,343,353 B2
(45) Date of Patent: May 17, 2016

(54) SOI STRUCTURE FOR SIGNAL ISOLATION AND LINEARITY

(71) Applicant: Newport Fab, LLC, Newport Beach, CA (US)

(72) Inventors: Paul D. Hurwitz, Irvine, CA (US); Robert L. Zwingman, Walnut, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 14/474,624

(22) Filed: Sep. 2, 2014

(65) Prior Publication Data

US 2014/0370686 A1 Dec. 18, 2014

Related U.S. Application Data

(62) Division of application No. 13/647,023, filed on Oct. 8, 2012.

(60) Provisional application No. 61/586,696, filed on Jan. 13, 2012.

(51) Int. Cl.
| | |
|---|---|
| *H01L 21/76* | (2006.01) |
| *H01L 21/764* | (2006.01) |
| *H01L 21/762* | (2006.01) |
| *H01L 21/02* | (2006.01) |
| *H01L 21/306* | (2006.01) |

(52) U.S. Cl.
CPC ........ *H01L 21/764* (2013.01); *H01L 21/02356* (2013.01); *H01L 21/306* (2013.01); *H01L 21/7624* (2013.01); *H01L 21/76237* (2013.01)

(58) Field of Classification Search
CPC ............ H01L 21/02356; H01L 21/306; H01L 21/76237; H01L 21/7624; H01L 21/764
USPC ............ 257/506, E21.546, E21.573; 438/422
See application file for complete search history.

(56) References Cited

U.S. PATENT DOCUMENTS

| | | | |
|---|---|---|---|
| 6,235,643 B1 * | 5/2001 | Mui et al. ...................... 438/719 |
| 2005/0148153 A1 * | 7/2005 | Takahashi ..................... 438/424 |
| 2009/0230508 A1 | 9/2009 | Dyer | |
| 2009/0236691 A1 | 9/2009 | Dyer | |
| 2010/0035403 A1 * | 2/2010 | Brown et al. ................. 438/422 |
| 2011/0291100 A1 | 12/2011 | Cheng | |
| 2012/0313168 A1 | 12/2012 | Cheng | |

* cited by examiner

*Primary Examiner* — Matthew Gordon
(74) *Attorney, Agent, or Firm* — Farjami & Farjami LLP

(57) ABSTRACT

Disclosed is a structure for improved electrical signal isolation between adjacent devices situated in a top semiconductor layer of the structure and an associated method for the structure's fabrication. The structure comprises a first portion of a trench extending through the top semiconductor layer and through a base oxide layer below the top semiconductor layer. A handle wafer is situated below the base oxide layer and a second portion of the trench, having sloped sidewalls, extends into the handle wafer. The sloped sidewalls are amorphized by an implant, for example, Xenon or Argon, to reduce carrier mobility in the handle wafer and improve electrical signal isolation between the adjacent devices situated in the top semiconductor layer.

18 Claims, 4 Drawing Sheets

SOI STRUCTURE FOR SIGNAL ISOLATION AND LINEARITY

This is a divisional of application Ser. No. 13/647,023 filed Oct. 8, 2012.

BACKGROUND

The present application claims the benefit of and priority to a pending provisional patent application entitled "SOI Structures Utilizing Trenches for Improved Electrical Signal Isolation and Linearity," Ser. No. 61/586,696 filed on Jan. 13, 2012. The disclosure in that pending provisional application is hereby incorporated fully by reference into the present application.

Silicon on insulator (SOI) structures are commonly utilized where a high degree of noise isolation or low signal loss is required. In conventional SOI structures, a conducting inversion layer is typically present at an interface between a base oxide and a high resistivity handle wafer. Requirements imposed by active devices within SOI structures also typically demand a top semiconductor layer having a much lower resistivity than the high resistivity handle wafer. The combination of a low resistivity top semiconductor layer and an inversion layer at the base oxide-handle wafer interface results in a lossy, non-linear network that degrades isolation and linearity within SOI structures at high frequencies and power levels.

Attempts to provide a high degree of noise isolation and low signal loss in SOI structures have included forming high resistance portions of the handle wafer in isolation trenches at the interface between the base oxide and handle wafer. However, as the area available for isolation trenches within SOI structures decreases, the effectiveness of such narrow high resistance portions of the handle wafer also decreases.

SUMMARY

The present disclosure is directed to silicon on insulator (SOI) structure and method for utilizing trenches for signal isolation and linearity, substantially as shown in and/or described in connection with at least one of the figures, and as set forth more completely in the claims.

DETAILED DESCRIPTION

Figure 1:
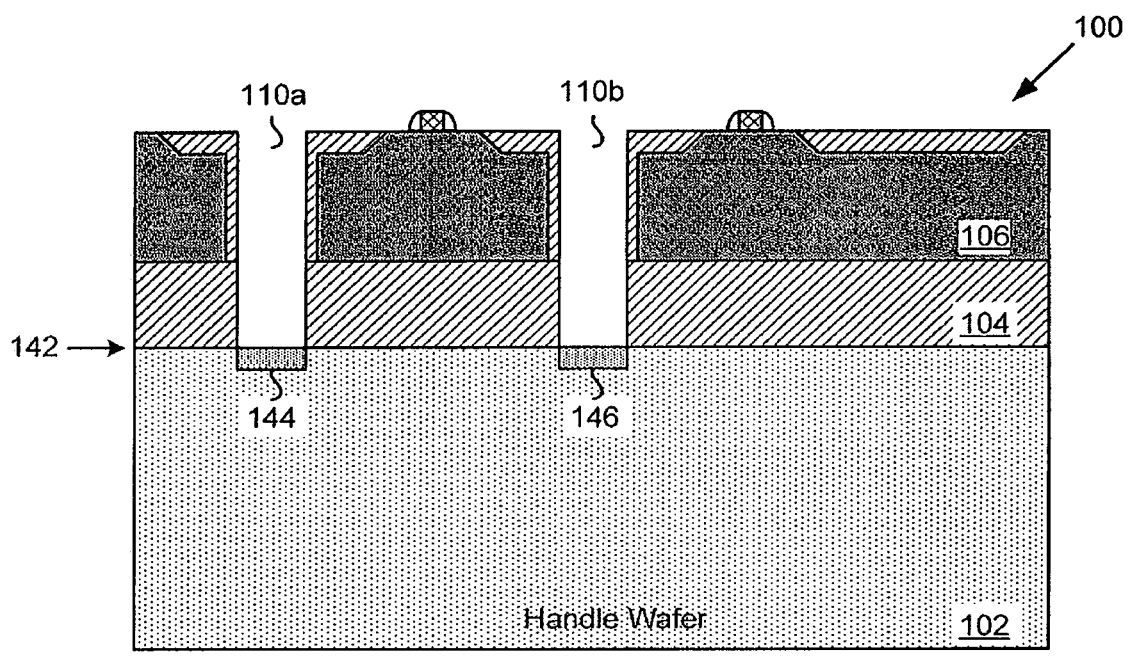
FIG. 1 illustrates an exemplary cross-sectional view of a conventional SOI structure for electrical signal isolation and linearity.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates an exemplary cross-sectional view of conventional silicon on insulator (SOI) structure 100 for electrical isolation of an active area including an amorphizing implant in a top surface of handle wafer 102. Conventional SOI structure 100 includes top semiconductor layer 106 disposed over base oxide layer 104, and handle wafer 102 disposed under base oxide layer 104. Trenches 110a and 110b having parallel sidewalls are etched through top semiconductor layer 106 and base oxide layer 104, terminating at interface 142 between base oxide layer 104 and underlying handle wafer 102. An amorphizing implant is then applied to the exposed flat, top surface of handle wafer 102 forming amorphized regions 144 and 146 in the bottom of trenches 110a and 110b, respectively. Amorphized regions 144 and 146 increase the impedance of a signal path between adjacent active devices disposed in, or on, top semiconductor layer 106. However, because a signal path length along amorphized regions 144 and 146 is limited to the widths of trenches 110a and 110b, the extent to which electrical signal isolation and linearity may be improved is unacceptably limited. Furthermore, as the area available for isolation trenches within SOI structures continues to decrease, the effectiveness of conventional isolation trenches continues to decrease.

The fabrication of an SOI structure for improving electrical signal isolation and linearity will now be described with reference to FIGS. 2A-2D and FIG. 3, in accordance to one implementation of the present invention. FIGS. 2A-2D illustrate exemplary progressive cross-sectional views of the fabrication of an SOI structure for improving electrical signal isolation and linearity, in accordance with one implementation of the present application. FIG. 3 shows an exemplary flowchart presenting actions taken to implement a method of fabricating an SOI structure for improving electrical signal isolation and linearity, in accordance with one implementation of the present application.

Figure 2A:
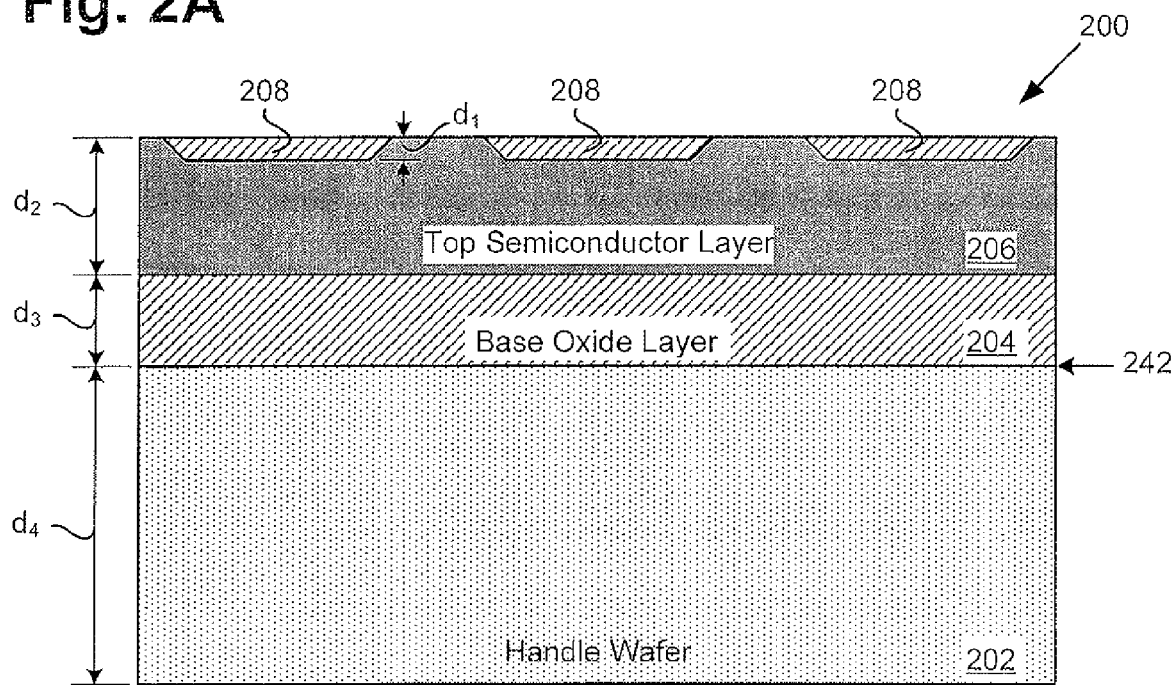
FIG. 2A illustrates an exemplary cross-sectional view during fabrication of an SOI structure for improving electrical signal isolation and linearity, in accordance with one implementation of the present application.
Figure 3:
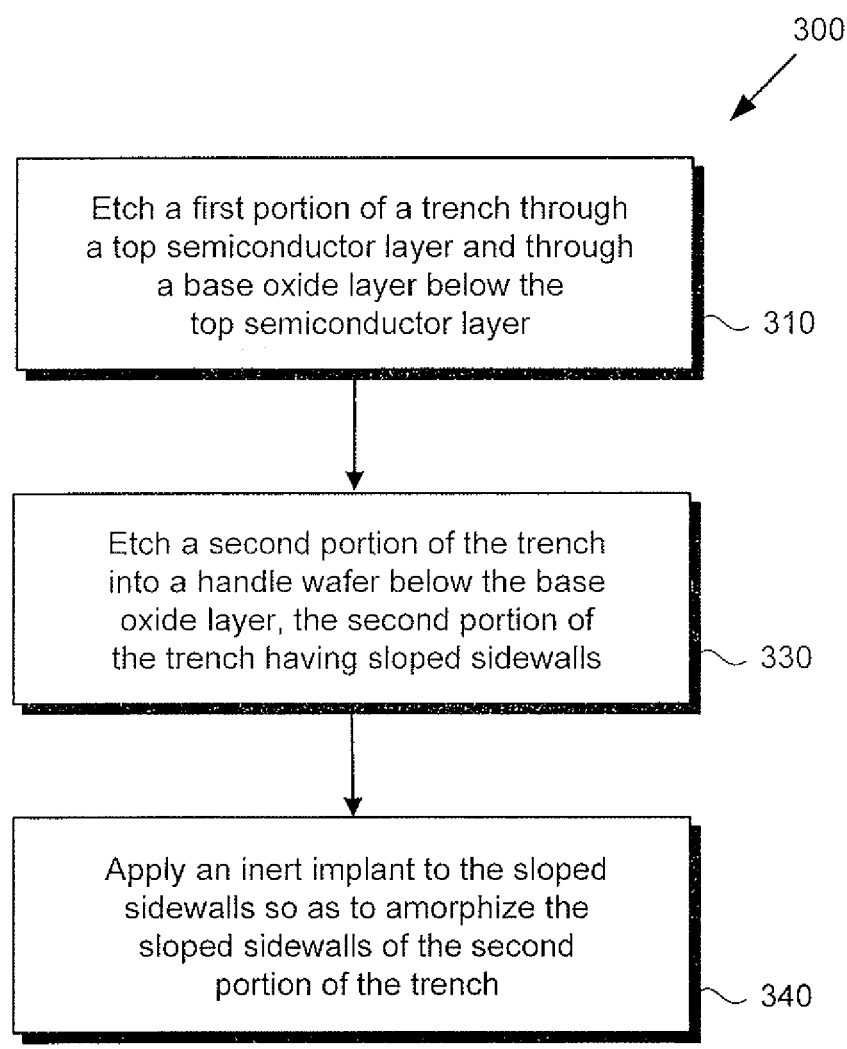
FIG. 3 presents an exemplary flowchart illustrating a method for fabricating an SOI structure for improving electrical signal isolation and linearity, in accordance with one implementation of the present application.

FIG. 2A shows a starting wafer after application of an active device isolation process commonly used in the fabrication of CMOS technology. Specifically, SOI structure 200 may include top semiconductor layer 206 disposed over base oxide layer 204, and base oxide layer 204 disposed over handle wafer 202. Shallow field oxide layers 208 may be disposed in a top surface of top semiconductor layer 206 to provide isolation between adjacent active regions of top semiconductor layer 204, for example. Field oxide layers 208 may have thickness $d_1$ of 0.3 µm, for example. Top semiconductor layer 206 may have thickness $d_2$ of between 1.5 µm and 2 µm, for example. And base oxide layer 204 and handle wafer 202 may have thicknesses $d_3$ and $d_4$, respectively, of 1 µm and up to 725 µm, respectively, for example. However, these thicknesses may be greater than or less than the above thicknesses depending on the specific requirements of a particular application.

Figure 2B:
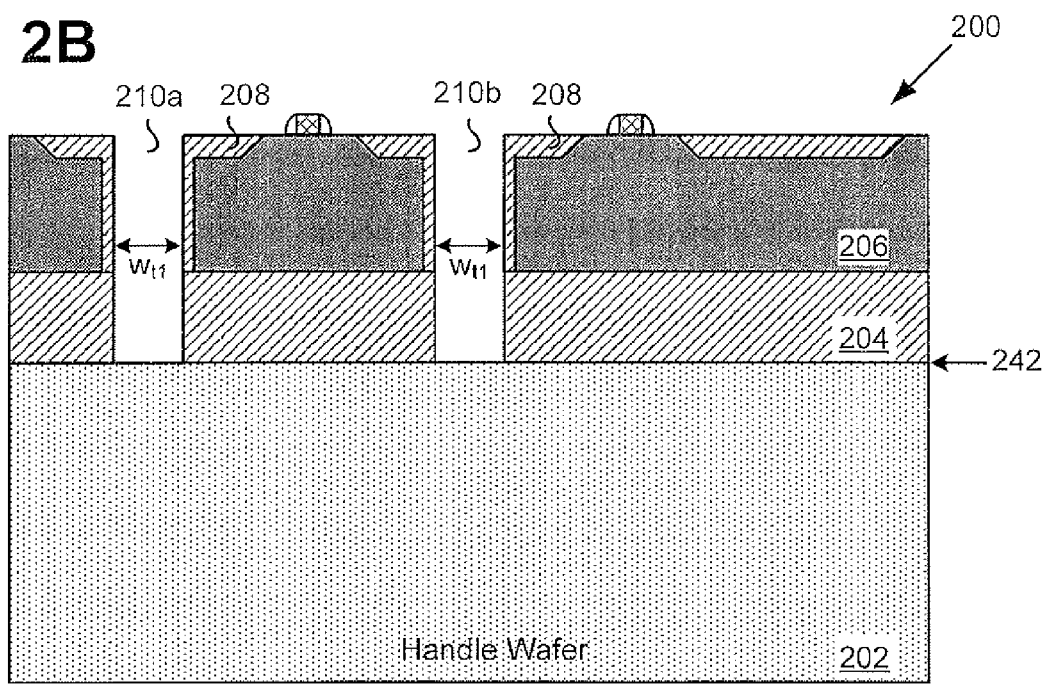
FIG. 2B illustrates an exemplary cross-sectional view during fabrication of an SOI structure for improving electrical signal isolation and linearity, in accordance with one implementation of the present application.

Referring now to action 310 of flowchart 300, action 310 includes etching a first portion of a trench through a top semiconductor layer and through a base oxide layer below the top semiconductor layer. FIG. 2B, for example, illustrates such an action applied to SOI structure 200 where trenches 210a and 210b are etched through field oxide layer 208, top semiconductor layer 206, and underlying base oxide layer 204. The etch is complete when the interface between base oxide layer 204 and underlying handle wafer 202 is reached. Existing methods such as a $CF_4$ based anisotropic dry etch, for example, may be used during etch action 310. The width $w_{t1}$ of the first portion of each of trenches 210a and 210b may be 1.5 µm, for example. However, trench width $w_{t1}$ may be greater than or less than this width to suit the specific needs of a particular application. Following etching of the first portion of the trench, a thin oxide layer may be deposited on the sidewalls of the first portion of trenches 210a and 210b to protect the adjacent surface of top semiconductor layer 206 from a subsequent heavy inert implant into underlying handle wafer 202.

Figure 2C:
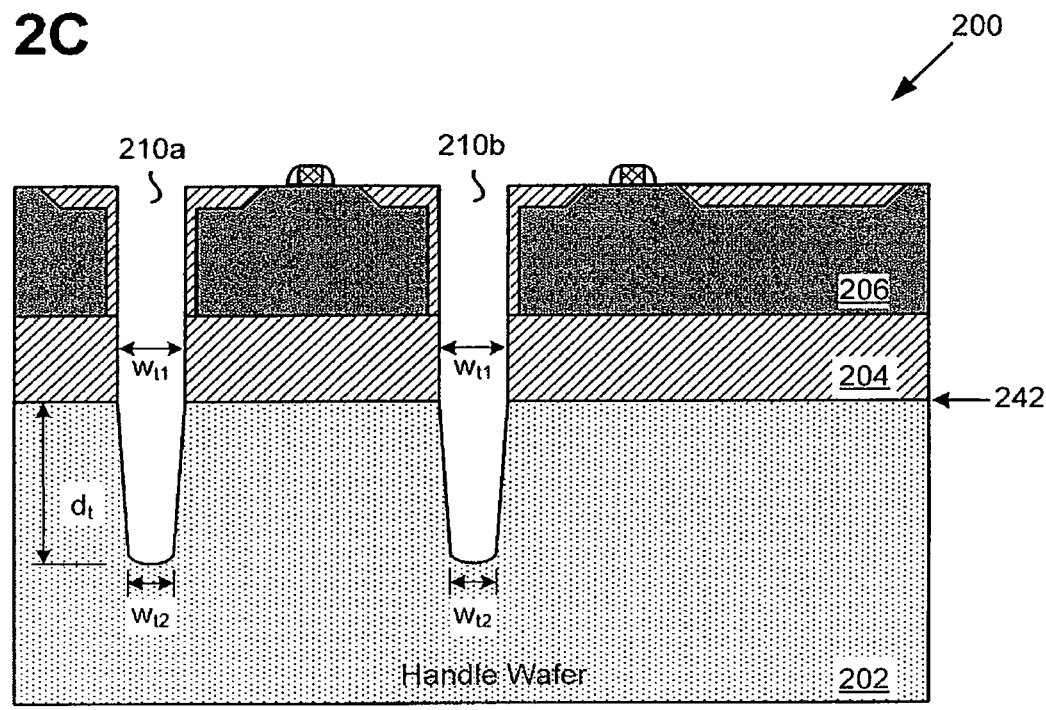
FIG. 2C illustrates an exemplary cross-sectional view during fabrication of an SOI structure for improving electrical signal isolation and linearity, in accordance with one implementation of the present application.

Continuing with action 320 of flowchart 300, action 320 includes etching a second portion of the trench into a handle wafer below the base oxide layer, the second portion of the trench having sloped sidewalls. FIG. 2C, for example, illustrates such an action applied to SOI structure 200 where second portions of trenches 210a and 210b are etched to a depth $d_t$ into handle wafer 202. In one specific example, depth $d_t$ may be about 7 µm. However, depth $d_t$ may be greater than or less than this depth to suit the specific needs of a particular application.

Action 320 may be carried out by reducing an etchant power as compared to an etchant power used in action 310, for example, allowing the formation of a narrower portion of trenches 210a and 210b to depth $d_t$. Additionally, or in the alternative, the width of the etch may be reduced by changing the etch chemistry to make the etch more selective. Though specific etch techniques are disclosed, action 320 may be achieved by any appropriate etching technique known to those of ordinary skill in the art. Thus, action 320 may result in a modest sloping of the second portion of each of trenches 210a and 210b such that a bottom portion of trenches 210a and 210b tapers to a second width $w_{t2}$. In one specific example, second width $w_{t2}$ may be 0.5 µm. However, second width $w_{t2}$ may be greater than or less than this width to suit the specific needs of a particular application. The modest slope of the sidewalls of the second portion of trenches 210a and 210b may be, for example, 15 degrees relative to the sidewalls of the first portions of trenches 210a and 210b. The modest slope of the sidewalls may help to improve the coverage of a subsequent amorphizing implant applied to the second portion of each of trenches 210a and 210b.

Figure 2D:
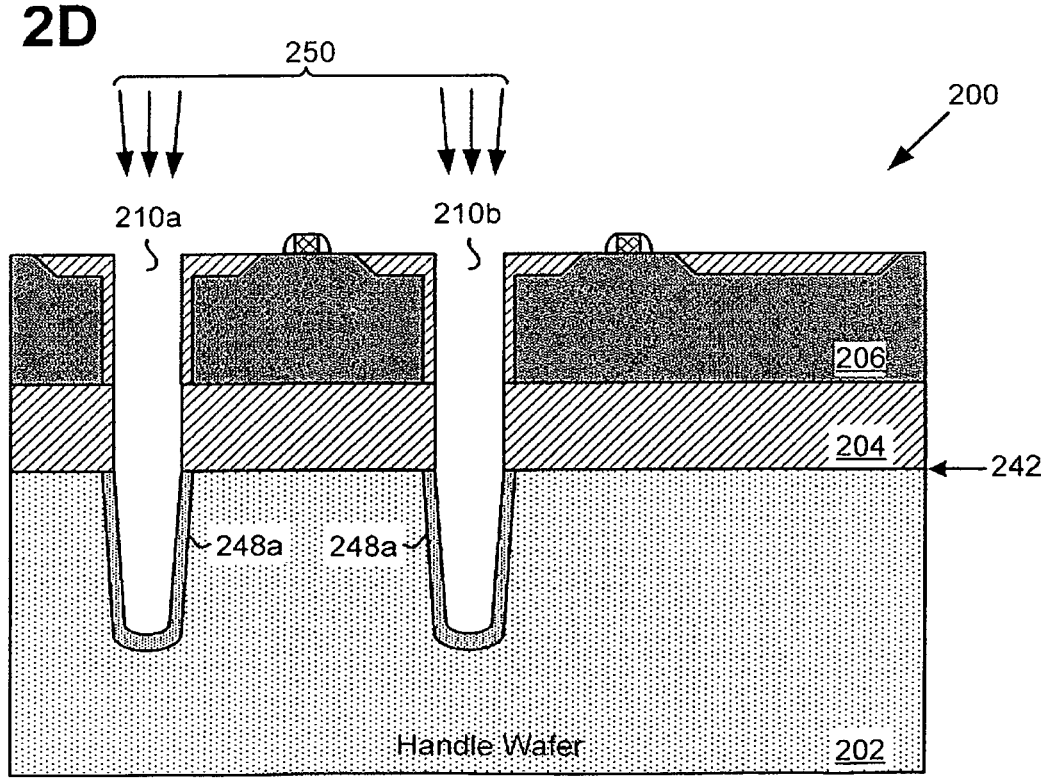
FIG. 2D illustrates an exemplary cross-sectional view during fabrication of an SOI structure for improving electrical signal isolation and linearity, in accordance with one implementation of the present application.

Continuing with action 330 of flowchart 300, action 330 includes applying an inert implant to the sloped sidewalls so as to amorphize the sloped sidewalls of the second portion of the trench. FIG. 2D, for example, illustrates such an action applied to SOT structure 200 where amorphizing inert implant 250 may be applied at the openings of trenches 210a and 210b to damage the handle wafer silicon in the sloped trenches. Amorphizing inert implant 250 may include a heavy element such as Argon or Xenon, for example, and may be applied at an implant energy of 50 KeV, for example. However, the implant energy may be greater than or less than 50 KeV, according to the requirements of a particular application. To optimally amorphize the sloped trench sidewalls, amorphizing inert implant 250 may be performed at a small angle relative to the sidewalls of the first portions of trenches 210a and 210b.

Amorphized regions 248a and 248b may contain a high density of carrier traps that significantly reduce the mobility of carriers in amorphized regions 248a and 248b, as compared to undamaged portions of handle wafer 202. The carrier traps pin carrier density in the amorphized regions, making the amorphized regions insensitive to any voltage potential present in top semiconductor layer 206. Thus, amorphized regions 248a and 248b provide superior isolation and linearity between adjacent devices situated in top semiconductor layer 206.

Thus, SOI structures for improving electrical signal isolation and linearity, according to one or more implementations of the present application, provide several advantages over conventional approaches. For example, path lengths along amorphized regions 248a and 248b are limited by depth $d_t$ of the second portion of trenches 210a and 210b, rather than width $w_{t1}$ of the trenches as in conventional SOI structures discussed above. Thus, the path length through amorphized regions 248a and 248b is advantageously increased from width $w_{t1}$ of the trench opening to more than twice depth $d_t$ of the second portion of trenches 210a and 210b. The increased path length results in an increased impedance between adjacent devices in top semiconductor layer 206 separated by trench 210a or 210b, for example. Consequently, any inversion layer located at interface 242 between base oxide 204 and handle wafer 202 will have a higher resistivity at the etched silicon surface of handle wafer 202 due to the increased path length. Thus, substrate related losses are reduced and linearity of the isolated devices is enhanced.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A method for improving electrical signal isolation between adjacent devices situated in a top semiconductor layer, said method comprising:
   etching a first portion of a trench through said top semiconductor layer and a base oxide layer below said top semiconductor layer to an interface between said base oxide layer and a handle wafer, said first portion of said trench having a width between substantially parallel sidewalls;
   etching a second portion of said trench from said interface into said handle wafer below said base oxide layer, said second portion of said trench having sloped sidewalls situated within said handle wafer;
   applying an implant to said sloped sidewalls so as to amorphize said sloped sidewalls of said second portion of said trench to form an amorphized region;
   wherein a depth of said second portion of said trench between said interface and a bottom of said trench is greater than said width of said first portion of said trench, such that a signal path length between two of said adjacent devices along said amorphized region is at least twice said depth of said second portion.

2. The method of claim 1, wherein said implant is an inert implant.

3. The method of claim 1, wherein said implant is selected from the group consisting of Xenon and Argon.

4. The method of claim 1, wherein said applying said implant to said sloped sidewalls increases an impedance between said adjacent devices situated in said top semiconductor layer.

5. The method of claim 1, wherein said etching of said first portion and said etching of said second portion of said trench are performed anisotropically.

6. The method of claim 1, wherein said second portion of said trench having sloped sidewalls is achieved by decreasing an etching power applied to an etchant during said etching said second portion of said trench.

7. The method of claim 1, wherein said second portion of said trench having sloped sidewalls is achieved by utilizing a selective etch chemistry during said etching said second portion of said trench.

8. The method of claim 1, wherein said etching of said first portion of said trench is performed using a $CF_4$-based dry etch.

9. The method of claim 1, wherein said etching of said second portion of said trench is performed using a $CF_4$-based dry etch.

10. A method for improving electrical signal isolation between devices situated in a semiconductor layer, said method comprising:
    etching a first portion of a trench through said semiconductor layer and a base oxide layer below said semiconductor layer to an interface between said base oxide layer and a handle wafer, said first portion of said trench having a width between substantially parallel sidewalls;
    etching a second portion of said trench from said interface into said handle wafer below said base oxide layer, said second portion of said trench having sloped sidewalls;
    applying an implant to said sloped sidewalls so as to amorphize said sloped sidewalls of said second portion of said trench to form an amorphized region;
    wherein a depth of said second portion of said trench between said interface and a bottom of said trench is greater than said width of said first portion of said trench, such that a signal path length between two of said devices along said amorphized region is at least twice said depth of said second portion.

11. The method of claim 10, wherein said implant is an inert implant.

12. The method of claim 10, wherein said implant is selected from the group consisting of Xenon and Argon.

13. The method of claim 10, wherein said applying said implant to said sloped sidewalls increases an impedance between said devices situated in said semiconductor layer.

14. The method of claim 10, wherein said etching of said first portion and said etching of said second portion of said trench are performed anisotropically.

15. The method of claim 10, wherein said second portion of said trench having sloped sidewalls is achieved by decreasing an etching power applied to an etchant during said etching said second portion of said trench.

16. The method of claim 10, wherein said second portion of said trench having sloped sidewalls is achieved by utilizing a selective etch chemistry during said etching said second portion of said trench.

17. The method of claim 10, wherein said etching of said first portion of said trench is performed using a $CF_4$-based dry etch.

18. The method of claim 10, wherein said etching of said second portion of said trench is performed using a $CF_4$-based dry etch.

* * * * *